US008263927B2

(12) United States Patent
Chan et al.

(10) Patent No.: US 8,263,927 B2
(45) Date of Patent: Sep. 11, 2012

(54) CIRCUIT AND METHOD FOR TEMPERATURE AND PROCESS INDEPENDENT TRANSIMPEDANCE AMPLIFIER ARRANGEMENT

(75) Inventors: William Chan, Irvine, CA (US); Peter Kim, Huntington Beach, CA (US)

(73) Assignee: Microsemi Corporation, Alisa Viejo, CA (US)

(*) Notice: Subject to any disclaimer, the term of this patent is extended or adjusted under 35 U.S.C. 154(b) by 273 days.

(21) Appl. No.: 12/861,919

(22) Filed: Aug. 24, 2010

(65) Prior Publication Data

US 2011/0062311 A1 Mar. 17, 2011

Related U.S. Application Data

(60) Provisional application No. 61/241,413, filed on Sep. 11, 2009.

(51) Int. Cl.
*H01J 40/14* (2006.01)
*H03F 3/04* (2006.01)

(52) U.S. Cl. ............ 250/214 A; 250/214 R; 250/214 C; 330/59; 330/307; 330/308

(58) Field of Classification Search ............... 250/214 R, 250/214 A, 214 LA, 214 AG, 214 C, 208.2; 330/59, 110, 256, 282, 289, 307, 308; 327/512, 327/514
See application file for complete search history.

(56) References Cited

U.S. PATENT DOCUMENTS

| 4,316,107 | A | | 2/1982 | Talbot |
| 5,525,929 | A | * | 6/1996 | Nagahori et al. ............ 330/110 |
| 5,910,745 | A | | 6/1999 | Zarabadi |
| 6,348,682 | B1 | | 2/2002 | Lee |
| 7,005,901 | B1 | | 2/2006 | Jiang et al. |
| 7,346,284 | B2 | | 3/2008 | Wan |
| 7,382,191 | B2 | | 6/2008 | Randlett |
| 7,486,065 | B2 | | 2/2009 | Lin et al. |
| 2008/0267638 | A1 | | 10/2008 | Nakashima et al. |
| 2008/0315949 | A1 | | 12/2008 | Douglas |
| 2009/0239321 | A1 | | 9/2009 | Shimoda et al. |

FOREIGN PATENT DOCUMENTS

WO 01/41306 A1 6/2001
* cited by examiner

*Primary Examiner* — Kevin Pyo
(74) *Attorney, Agent, or Firm* — Simon Kahn

(57) ABSTRACT

An integrated circuit transimpedance amplifier arrangement constituted of: a plurality of internal matched resistors; a current multiplier arranged to output a signal whose value is a function of an input current signal, an external resistor and a first set of the plurality of internal matched resistors; and an output transimpedance amplifier coupled to the output of the current multiplier, the output transimpedance amplifier exhibiting a gain whose value is a function of a second set of the plurality of internal matched resistors, wherein the output of the output transimpedance amplifier is a function of the input current signal, the external resistor, the first set of the plurality of internal matched resistors and the second set of the plurality of internal matched resistors, wherein the variations with temperature of the first set of the plurality of internal matched resistors and the second set of the plurality of internal matched resistors cancel.

14 Claims, 1 Drawing Sheet

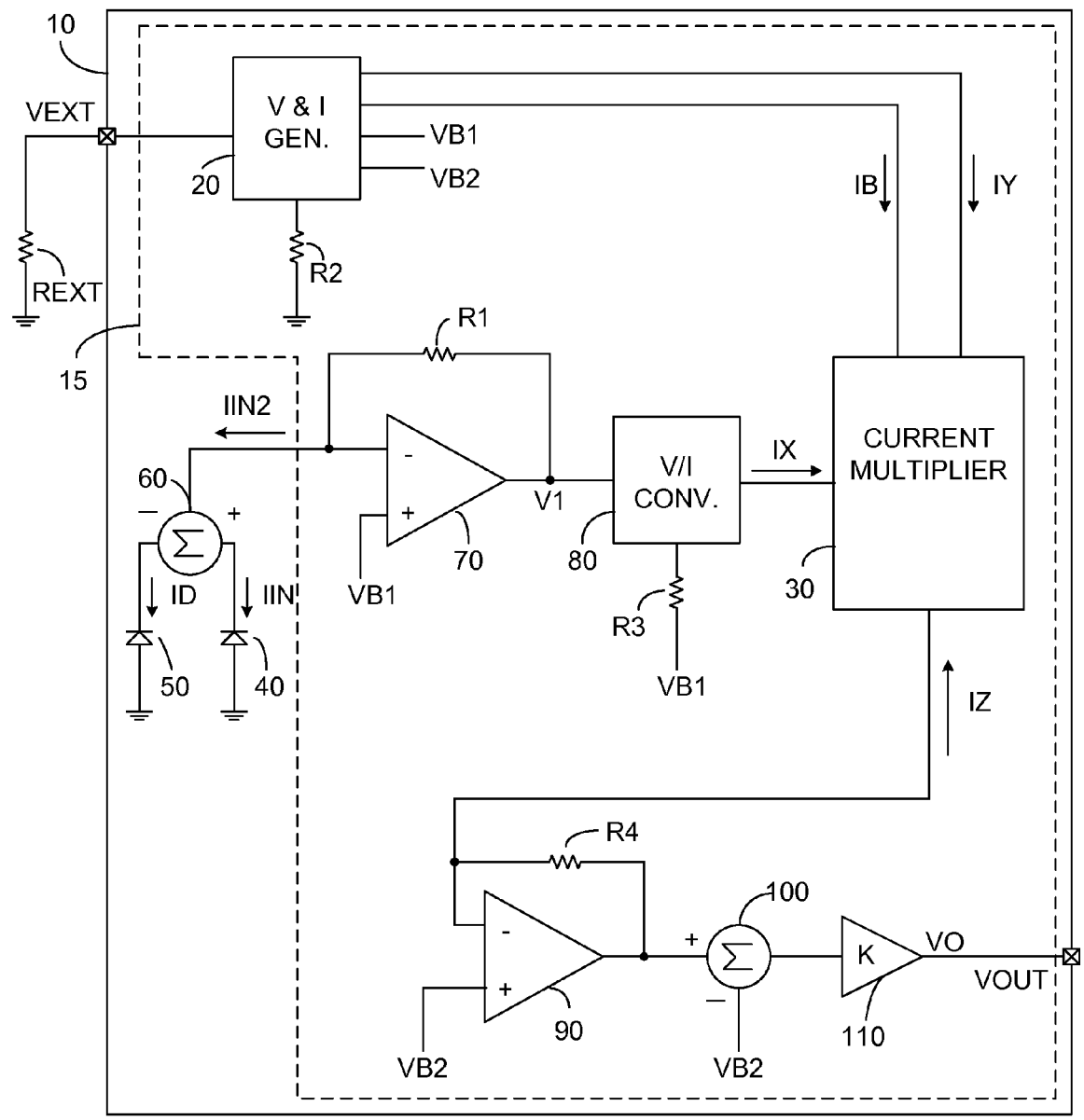

CIRCUIT AND METHOD FOR TEMPERATURE AND PROCESS INDEPENDENT TRANSIMPEDANCE AMPLIFIER ARRANGEMENT

CROSS-REFERENCE TO RELATED APPLICATION

This application claims priority from U.S. Provisional Patent Application Ser. No. 61/241,413 filed Sep. 11, 2009, of the same title, the entire contents of which are incorporated herein by reference.

TECHNICAL FIELD

The present application relates to the field of transimpedance amplifiers, and more particularly to a transimpedance amplifier arrangement exhibiting reduced temperature and process gain variation.

BACKGROUND OF THE INVENTION

Transimpedance amplifiers find use in many areas of electronics, since they convert a current to a voltage with a predetermined gain. One particular usage of transimpedance amplifiers is to convert the output of a photosensor, which outputs a current responsive to received light, to a voltage, thus resulting in a light sensor. Modern electronics provides large economies of scale by implementing as much circuitry as possible via integrated circuits, which can be economically mass produced.

The simplest transimpedance amplifier implemented with an operational amplifier (op-amp) is constituted of an op-amp with a feedback resistor connected between the output and the inverting input of the op-amp, with the input current to be converted further connected to the inverting input of the op-amp. The non-inverting input of the op-amp is connected to a common potential, and the output of the op-amp thus presents a voltage equal to the input current times the feedback resistor value. Unfortunately, the voltage value achievable by a simple transimpedance amplifier for the very low currents output by a photosensor diode typically requires yet further amplification, since the output of a photosensor diode which is to be amplified can be as low as a few picoamperes.

An op-amp based amplifier provides a fixed gain based on the ratio between two feedback resistors. Amplification of the output of the above described op-amp based transimpedance amplifier by an op-amp based amplifier thus results in an overall gain which is a function of the value of the resistors. Unfortunately, process variations in the production of integrated circuit based resistors result in resistor values which may be different than design values by up to 40% over a range of temperature conditions and process variations. Thus, the overall gain is not a fixed value, but is instead variable since it is responsive to the temperature conditions and process variations. It is possible to produce matched internal resistors which are physically near each other and thus respond in synchronization to die and external temperature variations, however as indicated above the overall gain of an op-amp based transimpedance amplifier followed by an op-amp based amplifier is a function of the product of two resistor values divided by a single resistor value. Thus, temperature and process variations do not cancel out.

The above can be resolved by the use of external resistors exhibiting a low temperature coefficient of resistance (TCR), however such resistors are expensive and require external terminals for connection which further significantly adds to cost.

Thus, it would be desirable to have a transimpedance amplifier arrangement exhibiting reduced temperature and process gain variation, preferably with few external components. Preferably, the transimpedance amplifier should exhibit sufficient gain for use with a photosensor so as to implement a light sensor exhibiting reduced temperature and process gain variation.

SUMMARY

Accordingly, it is a principal object of the present embodiments to overcome at least some of the disadvantages of the prior art. This is provided in certain embodiments by a integrated circuit transimpedance amplifier arrangement, the integrated circuit transimpedance amplifier arrangement comprising: a current multiplier; an output transimpedance amplifier coupled to the current multiplier; and a difference circuit coupled to the output transimpedance amplifier. The combination of the current multiplier, output transimpedance amplifier and difference circuit produces an output voltage which is a linear function of the input current, a single external resistance and a plurality of matched internal resistors whose variations with temperature and process cancel.

In one embodiment an additional output amplifier is provided, whose gain is dependent on the ratio of a pair of matched internal resistors. In another embodiment an additional input transimpedance amplifier is provided and a voltage to current conversion circuit, the input transimpedance amplifier and voltage to current conversion circuits being constituted of matched internal resistors.

In one embodiment, the integrated circuit transimpedance amplifier arrangement further comprises a pair of matched photo-diodes and an input difference circuit coupled to each of the pair of matched photo-diodes. A first one of the photo-diodes is exposed to a target light and a second one of the photo-diodes is not exposed to the target light. The difference between the currents of the pair of diodes is output by the input difference circuit and fed to the integrated circuit transimpedance amplifier, thus implementing a light sensor.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 1 illustrates a high level schematic diagram of a light sensor implemented with an integrated circuit transimpedance amplifier arrangement according to an exemplary embodiment.

DETAILED DESCRIPTION OF PREFERRED EMBODIMENTS

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level schematic diagram of a light sensor 10 implemented with an integrated circuit transimpedance amplifier arrangement 15 and a first photo-diode 40; a second photo-diode 50. Integrated circuit transimpedance amplifier arrangement 15 comprises: a plurality of internal matched resistors R1, R2, R3, R4, R5, R6, where internal resistors R5 and R6 are not shown; a low tolerance external resistor REXT; a voltage and current generator 20; a current multiplier 30; an input difference circuit 60; an input transimpedance amplifier 70; a voltage to current converter 80; an output transimpedance amplifier 90; an output difference circuit 100; and an output amplifier 110 exhibiting an amplification of K, where:

$$K = R5/R6 \qquad \text{EQ. 1}$$

Additionally, integrated circuit transimpedance amplifier arrangement 15 exhibits a pair of ports, VEXT and VOUT.

During the fabrication process of a resistor there are shifts in the process thereby causing variations in the resistance value of the resistor. The plurality of internal matched resistors R1, R2, R3, R4, R5 and R6 are manufactured under the same fabrication procedure, i.e. they have the same resistance per area unit and the resistance value of each of internal matched resistors R1, R2, R3, R4, R5, R6 will vary equally as the fabrication process shifts. The plurality of internal matched resistors R1, R2, R3, R4, R5 and R6 are preferably each placed on parallel axes, thus insuring that the internal matched resistors R1, R2, R3, R4, R5, R6 will each have the same temperature variation. First photo-diode 40 is placed in optical communication with a target colored light and second photo-diode 50 is place in complete darkness, preferably as a result of masking.

A first end of low tolerance external resistor REXT is connected to port VEXT and a second end of low tolerance external resistor REXT is connected to a common point, in one embodiment the common point being ground. Voltage and current generator 20 is connected to port VEXT and a first end of internal resistor R2. A first and second output of voltage and current generator 20 are connected to respective inputs of current multiplier 30. A second end of internal resistor R2 is connected to the common point. The anode of first photo-diode 40 is connected to the common point and the cathode of first photo-diode 40 is connected to the positive input of input difference circuit 60. The anode of second photo-diode 50 is connected to the common point and the cathode of second photo-diode 50 is connected to the negative input of input difference circuit 60. The output of input difference circuit 60 is connected to the inverting input of input transimpedance amplifier 70 and a first end of internal resistor R1. The non-inverting input of input transimpedance amplifier 70 is connected to a third output of voltage and current generator 20, denoted VB1. A second end of internal resistor R1 is connected to the output of input transimpedance amplifier 70 and a first input of voltage to current converter 80. A second input of voltage to current converter 80 is connected to a first end of internal resistor R3 and a second end of internal resistor R3 is connected to output VB1 of voltage and current generator 20. The output of voltage to current converter 80 is connected to a respective input of current multiplier 30.

The output of current multiplier 30 is connected to the inverting input of output transimpedance amplifier 90 and a first end of internal resistor R4. The non-inverting input of output transimpedance amplifier 90 is connected to a fourth output of voltage and current generator 20, denoted VB2. A second end of internal resistor R4 is connected to the output of output transimpedance amplifier 90 and the positive input of difference circuit 100. The negative input of difference circuit 100 is connected to output VB2 of voltage and current generator 20 and the output of difference circuit 100 is connected to the input of output amplifier 110. The output of output amplifier 110 is connected to port VOUT.

In operation, voltage and current generator 20 generates a band-gap voltage, denoted VBG, which is insensitive to temperature variations. Reference voltages VB1 and VB2 are also generated, each preferably generated as a function of VBG. Currents IY and IB are also generated as a function of band-gap voltage VBG. Specifically:

$$IY = VBG/R2 \qquad \text{EQ. 2}$$

$$IB = VBG/REXT \qquad \text{EQ. 3}$$

Colored light is applied to first photo-diode 40 thereby forming a current, denoted IIN, that begins to flow through first diode 40. Current IIN is also affected by temperature variations on first photo-diode 40. The same temperature variations cause a current, denoted IDARK, to flow through second photo-diode 50. Input difference circuit 60 forms a new current, denoted IIN2, where:

$$IIN2 = IIN - ID \qquad \text{EQ. 4}$$

Current IIN2 reflects the colored light applied to first photo-diode 40 without being affected by temperature variations on first photo-diode 40. Input transimpedance amplifier 70 forms a voltage at its output, denoted V1, where:

$$V1 = VB1 + IIN2*R1 \qquad \text{EQ. 5}$$

VB1 provides a constant reverse bias voltage to the voltage formed by first photo-diode 40. Voltage to current converter 80 converts voltage V1 into a current, denoted IX, where:

$$IX = IIN2*R1/R3 \qquad \text{EQ. 6}$$

Currents IX, IY and IB flow into current multiplier 30. Current multiplier 30 outputs a current, denoted IZ, where:

$$IZ = (IX*IY)/(2*IB) \qquad \text{EQ. 7}$$

$$(IX*IY)/(2*IB) = [(IIN-ID)*R1*VBG*REXT] / (R3*R2*2*VBG) \qquad \text{EQ. 8}$$

$$[(IIN-ID)*R1*VBG*REXT]/(R3*R2*2*VBG) = [(IIN-ID)*R1*REXT]/(2*R2*R3) \qquad \text{EQ. 9}$$

The combination of EQs. 6-8 form:

$$IZ = [(IIN-ID)*R1*REXT]/(2*R2*R3) \qquad \text{EQ. 10}$$

Output transimpedance amplifier 90 forms a voltage at its output, denoted V2, where:

$$V2 = VB2 + IZ*R4 \qquad \text{EQ. 11}$$

Voltage VB2 provides a reasonable operating voltage for the output of current multiplier 30. Voltage V2 is received by output difference circuit 100 and output amplifier 110 and forms a voltage at port VOUT, denoted VO, where:

$$VO=IZ*R4*R5/R6 \quad \text{EQ. 12}$$

The combination of EQs. 10 and 12 form:

$$VO=[(IIN-ID)*R1*R4*R5*REXT]/(2*R2*R3*R6) \quad \text{EQ. 13}$$

From EQ. 13 it is shown that:

$$VO/(IIN-ID)=(R1*R4*R5*REXT)/(2*R2*R3*R6) \quad \text{EQ. 14}$$

Since internal resistors R1, R2, R3, R4, R5, R6 are matched and of the same type their resistance values will change the same amount over process shift and temperature variations, as described above. Therefore (R1*R4*R5)/(2*R2*R3*R6) will remain constant over process shift and temperature variations. Since REXT is a low tolerance external resistor, the gain variation over process shift and temperature variations of integrated circuit transimpedance amplifier arrangement 15, shown in EQ. 14, is minimized to the first order.

Advantageously, the above arrangement preferably results in transimpedance amplifier arrangement 15 exhibiting a fast transient response time. In particular, transimpedance amplifier arrangement 15 exhibits a transient response of <5 µs, with the term transient response defined as the 10% to 90% change of the output rise and/or fall time in response to a respective input signal change of 50% of the maximum range, where the input signal rise and fall time is less than 100 ns. This transient response represents an improvement traditional current mirror approaches.

Thus the present embodiments enable an integrated circuit transimpedance amplifier arrangement providing only a first order gain variation over resistor process shifts and temperature variations. The output voltage of the integrated circuit transimpedance amplifier arrangement is a linear function of the input current, a single external resistance and a plurality of matched internal resistors.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

We claim:

1. An integrated circuit transimpedance amplifier arrangement comprising:
    a plurality of internal matched resistors;
    a current multiplier arranged to output a signal whose value is a function of an input current signal, an external resistor and a first set of said plurality of internal matched resistors; and
    an output transimpedance amplifier coupled to the output of said current multiplier, said output transimpedance amplifier exhibiting a gain whose value is a function of a second set of said plurality of internal matched resistors,
    wherein the output of said output transimpedance amplifier is a function of the input current signal, the external resistor, said first set of said plurality of internal matched resistors and said second set of said plurality of internal matched resistors, wherein the variations with temperature of said first set of said plurality of internal matched resistors and said second set of said plurality of internal matched resistors cancel.

2. The integrated circuit transimpedance amplifier arrangement of claim 1, further comprising an output difference circuit coupled to said output transimpedance amplifier, said output difference circuit arranged to cancel an offset of said output transimpedance amplifier.

3. The integrated circuit transimpedance amplifier arrangement of claim 2, further comprising an output amplifier coupled to said output difference circuit, said output amplifier exhibiting a gain whose value is a function of the output of said output transimpedance amplifier and a third set of said plurality of internal matched resistors, wherein the variations with temperature of the constituent resistors of said third set of said plurality of internal matched resistors cancel.

4. The integrated circuit transimpedance amplifier arrangement of claim 1, further comprising an input transimpedance amplifier and a voltage to current conversion unit coupled to said input transimpedance amplifier, the output of said voltage to current conversion unit exhibiting a gain whose value is a function of an input current and a fourth set of said plurality of internal matched resistors, wherein the variations with temperature of the constituent resistors of said fourth set of said plurality of internal matched resistors cancel.

5. The integrated circuit transimpedance amplifier arrangement of claim 1, further comprising:
    a first photo-diode exposed to a target light;
    a second photo-diode not exposed to the target light; and
    an input difference circuit arranged to provide the difference between the current of said first photo-diode and said second photo-diode,
    the output of said input difference circuit presenting said input current signal.

6. A method comprising:
    providing a plurality of internal matched resistors within an integrated circuit;
    multiplying a current to provide a signal whose value is a function of an input current signal, an external resistor and a first set of said provided plurality of internal matched resistors; and
    providing an output transimpedance amplifier coupled to provided signal, said provided output transimpedance amplifier exhibiting a gain whose value is a function of a second set of said provided plurality of internal matched resistors,
    wherein the output of said provided output transimpedance amplifier is a function of the input current signal, an external resistor, said first set of said provided plurality of internal matched resistors and said second set of said provided plurality of internal matched resistors, wherein the variations with temperature of said first set of said provided plurality of internal matched resistors and said second set of said provided plurality of internal matched resistors cancel.

7. The method of claim 6, further comprising:
canceling an offset of said provided output transimpedance amplifier.

8. The method of claim 7, further comprising:
amplifying said cancelled offset output of said provided output transimpedance amplifier by a function of the output of said provided output transimpedance amplifier and a third set of said provided plurality of internal matched resistors, wherein the variations with temperature of the constituent resistors of said third set of said plurality of internal matched resistors cancel.

9. The method of claim 6, further comprising:
providing an input transimpedance amplifier and a voltage to current conversion unit coupled to said provided input transimpedance amplifier, the output of said provided voltage to current conversion unit exhibiting a gain whose value is a function of an input current and a fourth set of said provided plurality of internal matched resistors, wherein the variations with temperature of the constituent resistors of said fourth set of said plurality of internal matched resistors cancel.

10. The method of claim 6, further comprising:
providing a first photo-diode exposed to a target light;
providing a second photo-diode not exposed to the target light; and
producing the input current signal as a function of the difference between the current of said first photo-diode and said second photo-diode.

11. A light sensor comprising:
a plurality of internal matched resistors;
a first photo-diode exposed to a target light;
a second photo-diode not exposed to the target light;
an input difference circuit arranged to output a signal representing the difference between the current of said first photo-diode and said second photo-diode;
a current multiplier coupled to the output of said input difference circuit, said current multiplier arranged to output a signal whose value is a function of said signal representing the difference output by said input difference circuit, an external resistor and a first set of said plurality of internal matched resistors; and
an output transimpedance amplifier coupled to the output of said current multiplier, said output transimpedance amplifier exhibiting a gain whose value is a function of a second set of said plurality of internal matched resistors,
wherein the output of said output transimpedance amplifier is a function of said signal representing the difference output by said input difference circuit, the external resistor, said first set of said plurality of internal matched resistors and said second set of said plurality of internal matched resistors, wherein the variations with temperature of said first set of said plurality of internal matched resistors and said second set of said plurality of internal matched resistors cancel.

12. The light sensor of claim 11, further comprising an output difference circuit coupled to said output transimpedance amplifier, said output difference circuit arranged to cancel an offset of said output transimpedance amplifier.

13. The light sensor of claim 12, further comprising an output amplifier coupled to said output difference circuit, said output amplifier exhibiting a gain whose value is a function of the output of said output transimpedance amplifier and a third set of said plurality of internal matched resistors, wherein the variations with temperature of the constituent resistors of said third set of said plurality of internal matched resistors cancel.

14. The light sensor of claim 13, further comprising an input transimpedance amplifier and a voltage to current conversion unit coupled to said input transimpedance amplifier, the output of said voltage to current conversion unit exhibiting a gain whose value is a function of an input current and a fourth set of said plurality of internal matched resistors, wherein the variations with temperature of the constituent resistors of said fourth set of said plurality of internal matched resistors cancel.

\* \* \* \* \*